(12) United States Patent
Xie et al.

(10) Patent No.: US 11,696,415 B2
(45) Date of Patent: Jul. 4, 2023

(54) HINGE STRUCTURE, FOLDING MECHANISM AND MOBILE TERMINAL

(71) Applicant: HuiZhou TCL Mobile Communication Co., Ltd., HuiZhou (CN)

(72) Inventors: Yongqiu Xie, HuiZhou (CN); Yiju Chen, HuiZhou (CN)

(73) Assignee: HuiZhou TCL Mobile Communication Co., Ltd., HuiZhou (CN)

( * ) Notice: Subject to any disclaimer, the term of this patent is extended or adjusted under 35 U.S.C. 154(b) by 266 days.

(21) Appl. No.: 17/312,518

(22) PCT Filed: Nov. 26, 2019

(86) PCT No.: PCT/CN2019/120892
§ 371 (c)(1),
(2) Date: Jun. 10, 2021

(87) PCT Pub. No.: WO2020/192161
PCT Pub. Date: Oct. 1, 2020

(65) Prior Publication Data
US 2022/0061174 A1 Feb. 24, 2022

(30) Foreign Application Priority Data

Mar. 26, 2019 (CN) .......................... 201910233738.5

(51) Int. Cl.
*H05K 5/02* (2006.01)
*G06F 1/16* (2006.01)
(Continued)

(52) U.S. Cl.
CPC ............ *H05K 5/0226* (2013.01); *F16C 11/04* (2013.01); *G06F 1/1641* (2013.01);
(Continued)

(58) Field of Classification Search
CPC .... G06F 1/1616; G06F 1/1641; G06F 1/1652; G06F 1/1679; G06F 1/1681; H05K 5/0017; H05K 5/0226
See application file for complete search history.

(56) References Cited

U.S. PATENT DOCUMENTS 9,818,961 B2 * 11/2017 Hiroki ..................... G09F 9/301
9,870,031 B2 * 1/2018 Hsu ........................ G06F 1/1681
(Continued)

FOREIGN PATENT DOCUMENTS

CN 206596050 10/2017
CN 108712529 10/2018
(Continued)

*Primary Examiner* — Abhishek M Rathod

(57) ABSTRACT

A hinge structure includes a main support including a sliding groove disposed therein; a limit support rotationally connected to the main support via a straight shaft disposed in the sliding groove, and a limit groove is disposed at one side of the limit support; a sub support connected to the limit support via a crank shaft, wherein the sub support is sleeved on the crank shaft, a crank sliding block is disposed at one end of the crank shaft and in the limit groove; and a shaft sleeve; wherein when the main support rotates relative to the sub support, the straight shaft slides in the sliding groove and the crank sliding block slides in the limit groove. A folding mechanism and a mobile terminal are also provided.

20 Claims, 7 Drawing Sheets

(51) Int. Cl.
  *H05K 5/00* (2006.01)
  *F16C 11/04* (2006.01)
  *E05D 3/18* (2006.01)
  *H04M 1/02* (2006.01)

(52) U.S. Cl.
  CPC .......... *G06F 1/1652* (2013.01); *G06F 1/1681* (2013.01); *H05K 5/0017* (2013.01); *E05D 3/18* (2013.01); *E05Y 2900/606* (2013.01); *H04M 1/0214* (2013.01); *H04M 1/0268* (2013.01)

(56) References Cited

U.S. PATENT DOCUMENTS

| | | | |
|---|---|---|---|
| 9,927,841 B2* | 3/2018 | Gheorghiu | G06F 1/1681 |
| 10,209,743 B1* | 2/2019 | Hsu | G06F 1/1681 |
| 10,244,653 B2* | 3/2019 | Hsu | E05D 7/009 |
| 10,287,808 B2* | 5/2019 | Zhang | E05D 3/18 |
| 10,383,241 B2* | 8/2019 | Lin | E05D 7/00 |
| 10,928,863 B2* | 2/2021 | Pelissier | G06F 1/1681 |
| 2014/0174226 A1* | 6/2014 | Hsu | E05D 3/122 74/98 |
| 2016/0215541 A1* | 7/2016 | Tazbaz | E05D 7/00 |
| 2018/0066464 A1* | 3/2018 | Tazbaz | H04M 1/022 |
| 2018/0110139 A1 | 4/2018 | Seo et al. | |
| 2019/0391618 A1* | 12/2019 | Hsu | G06F 1/1652 |
| 2021/0084133 A1 | 3/2021 | Cheng et al. | |

FOREIGN PATENT DOCUMENTS

| | | |
|---|---|---|
| CN | 109451114 | 3/2019 |
| CN | 110005694 | 6/2019 |

* cited by examiner

HINGE STRUCTURE, FOLDING MECHANISM AND MOBILE TERMINAL

RELATED APPLICATIONS

This application is a National Phase of PCT Patent Application No. PCT/CN2019/120892 having International filing date of Nov. 26, 2019, which claims the benefit of priority of Chinese Patent Application No. 201910233738.5 filed on Mar. 26, 2019. The contents of the above applications are all incorporated by reference as if fully set forth herein in their entirety.

The present disclosure relates to the technology field of terminals, and more particularly to a hinge structure, a folding mechanism, and a mobile terminal.

FIELD AND BACKGROUND OF THE INVENTION

Large screen mobile phones have obvious advantages in user experience with respect to small screen mobile phones. However, the large screen mobile phones have disadvantages in handheld comfort and portability with respect to the small screen mobile phones. In the corresponding prior art, a folding mobile terminal is folded by a hinge structure. A flexible display screen can be unfolded and folded by the hinge structure. However, the flexible display screen is easily damaged during a folding process of the hinge structure.

Embodiments of the present disclosure provide a hinge structure, a folding mechanism, and a mobile terminal which are capable of decreasing damage of a flexible display screen when the mobile terminal is folded.

SUMMARY OF THE INVENTION

In a first aspect, an embodiment of the present disclosure provides a hinge structure, including:

a main support, wherein the main support includes a sliding groove disposed therein;

a limit support, wherein the limit support is rotationally connected to the main support via a straight shaft, the straight shaft is disposed in the sliding groove, and a limit groove is disposed at one side of the limit support;

a sub support, wherein the sub support is connected to the limit support via a crank shaft, the sub support is sleeved on the crank shaft, a crank sliding block is disposed at one end of the crank shaft, and the crank sliding block is disposed in the limit groove; and a shaft sleeve, wherein the shaft sleeve includes a first sub sleeve and a second sub sleeve which are respectively disposed at two ends of the shaft sleeve, the first sub sleeve is sleeved on the straight shaft, and the second sub sleeve is sleeved on the crank shaft;

wherein when the main support rotates relative to the sub support, the straight shaft slides in the sliding groove and the crank sliding block slides in the limit groove.

In a second aspect, an embodiment of the present disclosure provides a folding mechanism, including a first end, a second end, and at least two connection components;

wherein the first end and the second end are configured to be connected to an external mechanism; and each of the connection components includes at least one hinge structure, two adjacent ones of the connection components are connected via the at least one hinge structure, and the at least two connection components are disposed between the first end and the second end.

In a third aspect, an embodiment of the present disclosure provides a mobile terminal, including a first end, a second end, and at least two connection components;

wherein the folding mechanism is stated as above, the first housing is connected to the second housing via the folding mechanism, and the flexible display screen is disposed on the first housing, the folding mechanism, and the second housing; when the first housing and the second housing are in a folded state, the flexible display screen is bent; and when the first housing and the second housing are in an unfolded state, the flexible display screen is unfolded to be a flat plane.

In the hinge structure, the folding mechanism, and the mobile terminal provided by the embodiments of the present disclosure, at least two hinge structures cooperate to constitute the folding mechanism, and the folding mechanism is applied to the mobile terminal. When the mobile terminal is folded, damage of a flexible display screen can be decreased.

BRIEF DESCRIPTION OF THE SEVERAL VIEWS OF THE DRAWINGS

In order to more clearly illustrate the embodiments or the technical schemes in the prior art, the following drawings of the embodiments or in the prior art will be briefly introduced. It is obvious that the drawings are merely some embodiments of the present disclosure, those skilled in the art may derive other drawings according the drawings described below without creative endeavor.

DESCRIPTION OF SPECIFIC EMBODIMENTS OF THE INVENTION

A clear and complete description of the technical schemes in the embodiments of the present disclosure is made in conjunction with the accompanying drawings in the embodiments of the present disclosure. The described embodiments are merely a part and not all of the embodiments of the present disclosure. Based on the embodiments of the present disclosure, all other embodiments acquired by those skilled in the art without any creative endeavor are within the scope of protection of the present disclosure.

Embodiments of the present disclosure provide a hinge structure, a folding mechanism, and a mobile terminal. The hinge structure, the folding mechanism, and the mobile terminal will be described in detail as follows. The mobile terminal can be a smart terminal, a tablet, a wearable device, a handheld computer and so on. The mobile terminal can also be a game device, an augmented reality (AR) device, an audio play device, a video play device and so on.

Figure 1:
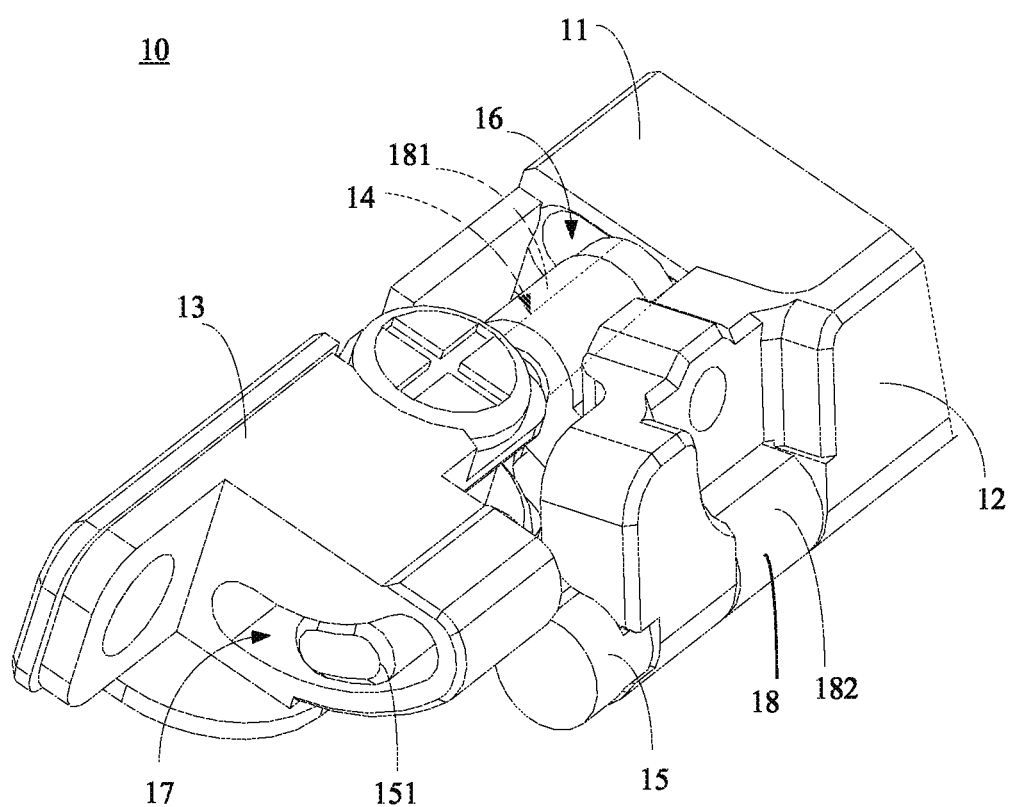
FIG. 1 illustrates a first structure diagram of a hinge structure provided by an embodiment of the present disclosure.

Please refer to FIG. 1. FIG. 1 illustrates a first structure diagram of a hinge structure provided by an embodiment of the present disclosure. In the present embodiment, the hinge structure 10 includes a main support 11, a limit support 13, a sub support 12, and a shaft sleeve 18. The main support 11 includes a sliding groove 16 disposed therein. The limit support 13 is rotationally connected to the main support 11 via a straight shaft 14. The straight shaft 14 is disposed in the sliding groove 16. A limit groove 17 is disposed at one side of the limit support 13. The sub support 12 is connected to the limit support 13 via a crank shaft 15. The sub support 12 is sleeved on the crank shaft 15. A crank sliding block 151 is disposed at one end of the crank shaft 15. The crank sliding block 151 is disposed in the limit groove 17. The shaft sleeve 18 includes a first sub sleeve 181 and a second sub sleeve 182 which are respectively disposed at two ends of the shaft sleeve 18. The first sub sleeve 181 is sleeved on the straight shaft 14. The second sub sleeve 182 is sleeved on the crank shaft 15. When the main support 11 rotates relative to the sub support 12, the straight shaft 14 slides in the sliding groove 16 and the crank sliding block 151 slides in the limit groove 17. The crank sliding block 151 and the straight shaft 14 respectively slide in the limit groove 17 and the sliding groove 16, so that the sub support 12 rotates relative to the main support 11. A rotation angle is formed by the sub support 12 and the main support 11. The sub support 12 shifts relative to the main support 11.

Figure 2:
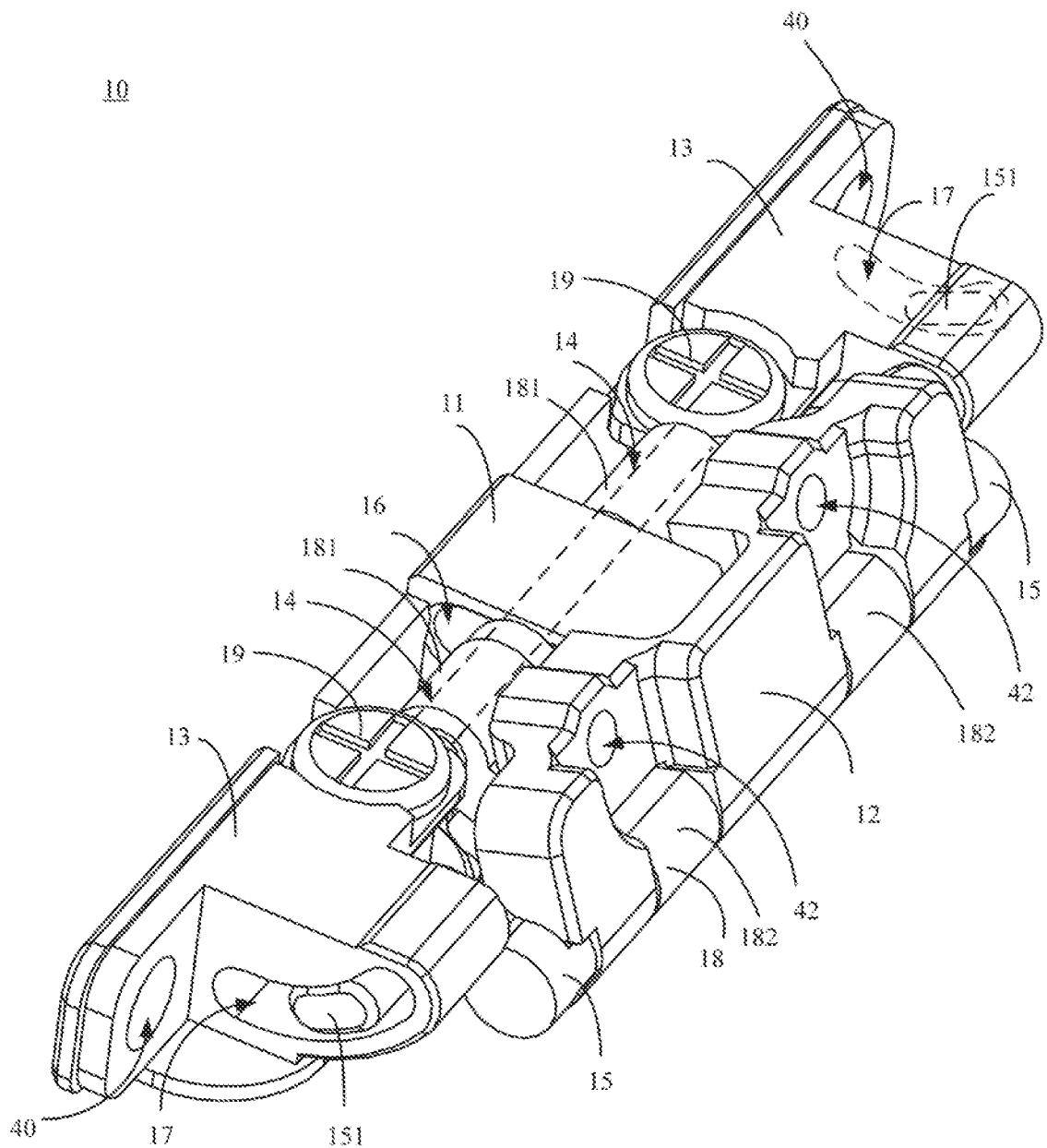
FIG. 2 illustrates a second structure diagram of a hinge structure provided by an embodiment of the present disclosure.

Please refer to FIG. 2. FIG. 2 illustrates a second structure diagram of a hinge structure provided by an embodiment of the present disclosure. In the present embodiment, there are two limit supports 13, two crank shafts 15, and two shaft sleeves 18. The main support 11 is disposed between the two limit supports 13. Each of the two limit supports 13 is rotationally connected to the main support 11 via one straight shaft 14. The sub support 12 is disposed between the two crank shafts 15. The two shaft sleeves 18 are disposed at two sides of the sub support 12 and disposed between the two crank shafts 15.

The two limit supports 13 are disposed at two sides of the main support 11 and symmetrically disposed. The two crank shafts 15 and the two shaft sleeves 18 are disposed at the two sides of the sub support 12 and symmetrically disposed. Two limit grooves 17 are respectively disposed in the two limit supports 13. The two limit grooves 17 are symmetrically disposed. Two crank sliding blocks 151 are respectively disposed on the two crank shafts 15. The two crank sliding blocks 151 can be respectively slide in the limit grooves 17.

The two limit supports 13 are respectively fixed and connected to the main support 11 via two screws 19. Each of the two shaft sleeves 18 includes a first sub sleeve 181 and a second sub sleeve 182. The two first sub sleeves 181 are sleeved on the straight shaft 14. The two second sub sleeves 182 are respectively sleeved on the two crank shafts 15. The two shaft sleeves 18 are movable relative to the straight shaft 14 and the crank shafts 15. The straight shaft 14 and the two crank shafts 15 can be rotatable in the shaft sleeves 18.

Functions achieved by the above-mentioned components which are symmetrically disposed are basically the same. When the two crank sliding blocks 151 which are symmetrically disposed slide in the corresponding limit grooves 17, the two crank shafts 15 which are symmetrically disposed and the shaft sleeves 18 which are sleeved on the crank shafts 15 drive the straight shaft 14 to slide in the sliding groove 16. The sub support 12 rotates relative to the main support 11. A rotation angle is formed between the sub support 12 and the main support 11.

In some embodiments, each of the limit grooves 17 is an arc limit groove. The sliding groove 16 is a cylindrical sliding groove. The two crank sliding blocks 151 partially fit in the arc limit grooves and can slide in the arc limit grooves. A middle portion of the straight shaft 14 is disposed in the cylindrical sliding groove. A damping slide is produced between the straight shaft 14 and the cylindrical sliding groove by interference fit between the straight shaft 14 and the cylindrical sliding groove. "Interference" refers to that a subtraction of a size of a fit axis from a size of a hole is negative. "Interference fit" refers to the fit with interference (including minimum interference equal to zero) in which a tolerance zone of the hole is below a tolerance zone of the axis. "Interference fit" refers to that an algebraic difference of the subtraction of the size of fix axis in each direction from the size of the hole in each direction is negative. In detail, in the machining and manufacturing process, a fit state of two or more parts can be roughly divided into many grades, such as sliding fit, transition fit and tight fit. The interference fit is one type of the tight fit. That is, a matched shaft diameter has to be greater than a hole diameter. Accordingly, it is necessary to cram the axis into the hole by a special tool. Alternatively, the hole is heated to expand the hole by the characteristics of thermal expansion and contraction, and then the axis is sleeved in the hole. The two parts are fit into one piece after cooling and contraction. The amount of interference can be customized according to practical requirements.

Figure 3:
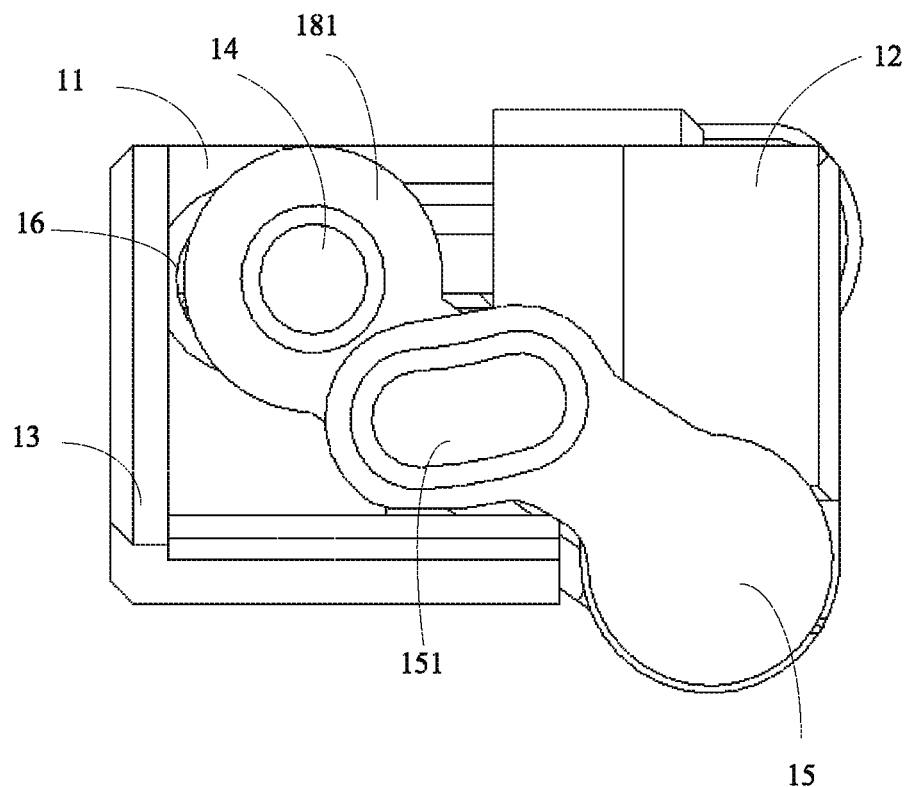
FIG. 3 illustrates a diagram of a first state of the hinge structure provided by an embodiment of the present disclosure.

Please refer to FIG. 3 to better understand a rotation state of the hinge structure. FIG. 3 illustrates a diagram of a first state of the hinge structure provided by an embodiment of the present disclosure.

Figure 4:
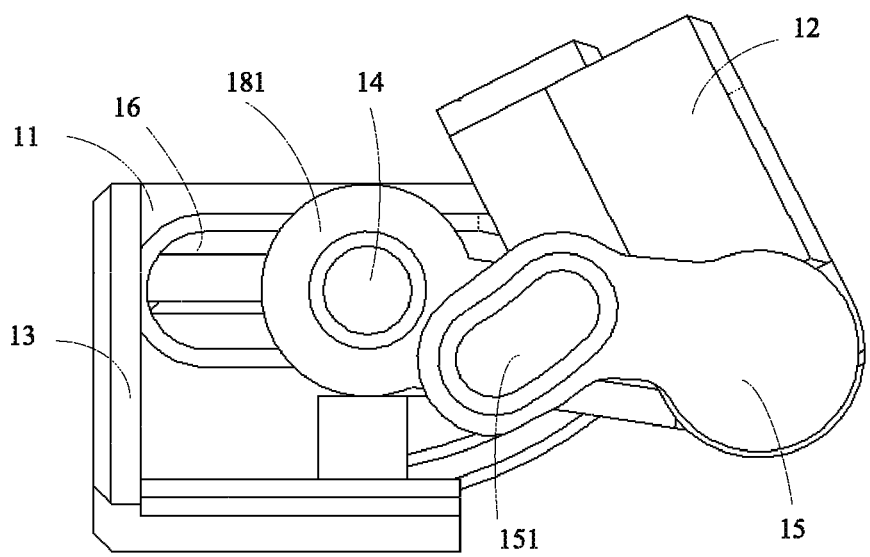
FIG. 4 illustrates a diagram of a second state of the hinge structure provided by an embodiment of the present disclosure.

In the present embodiment, when the hinge structure is in the first state, a bottom of the crank shaft 15 connected to the sub support 12 is positioned at a lowest point. The crank sliding block 151 disposed on the crank shaft 15 is positioned at a lowest point of the limit groove 17. The straight shaft 14 is positioned at a leftmost end of the sliding groove 16. The first sub sleeve 181 of the shaft sleeve 18 is sleeved on the straight shaft 14. The second sub sleeve 182 is sleeved on the crank shaft 15. The straight shaft 14 and the crank sliding block 151 can respectively slide in the sliding groove 16 and the limit groove 17. Please continue to refer to FIG. 4 in which the straight shaft 14 and the crank sliding block 151 slide. FIG. 4 illustrates a diagram of a second state of the hinge structure provided by an embodiment of the present disclosure. Rotation is produced between the sub support 12 and the main support 11. The sub support 12 can rotate relative to the main support 11. The crank sliding block 151 upwardly slides from the lowest point of the limit groove 17, and the bottom of the crank shaft 15 moves in a direction far away from the main support 11. The shaft sleeve 18 drags the straight shaft 14 to slide from the leftmost end of the sliding groove 16 to the right. Since damping motion is produced due to the interference fit between the straight shaft 14 and the sliding groove 16, a specific angle can be formed between the sub support 12 and the main support 11 and the angle remains. When the sub support 12 does not suffer from external force, the hinge structure 10 is stable in a current state and does not go back to the first state.

Figure 5:
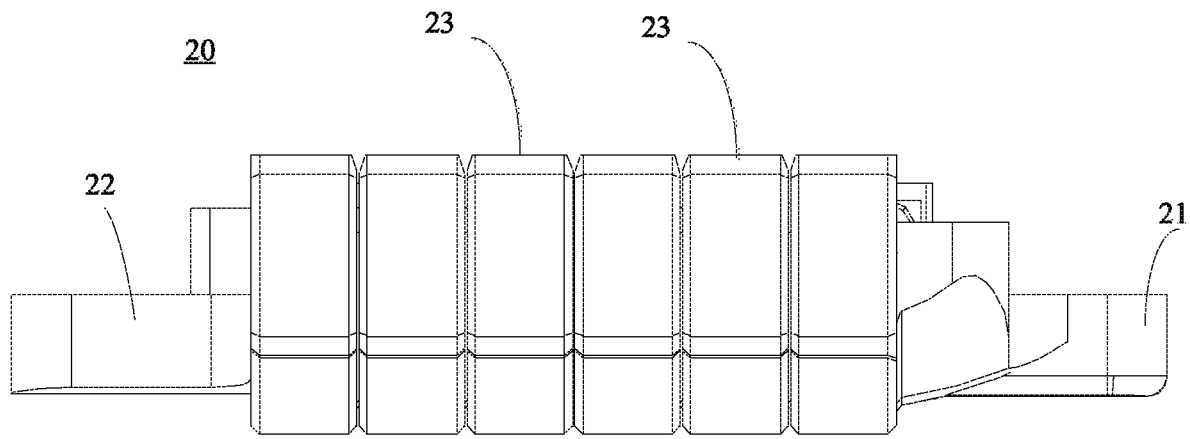
FIG. 5 illustrates a folding mechanism in an unfolded state provided by an embodiment of the present disclosure.

Please continue to refer to FIG. 5. FIG. 5 illustrates a folding mechanism in an unfolded state provided by an embodiment of the present disclosure. The folding mechanism 20 includes a first end 21, a second end 22, and at least two connection components 23. Each of the connection components 23 includes at least one above-mentioned hinge structure 10. The at least two connection components 23 are connected via the hinge structure 10. The at least two connection components 23 are disposed between the first end 21 and the second end 22. When the folding mechanism 20 is unfolded, the first end 21, the second end 22, and the connection components 23 are approximately positioned in the same plane.

Figure 6:
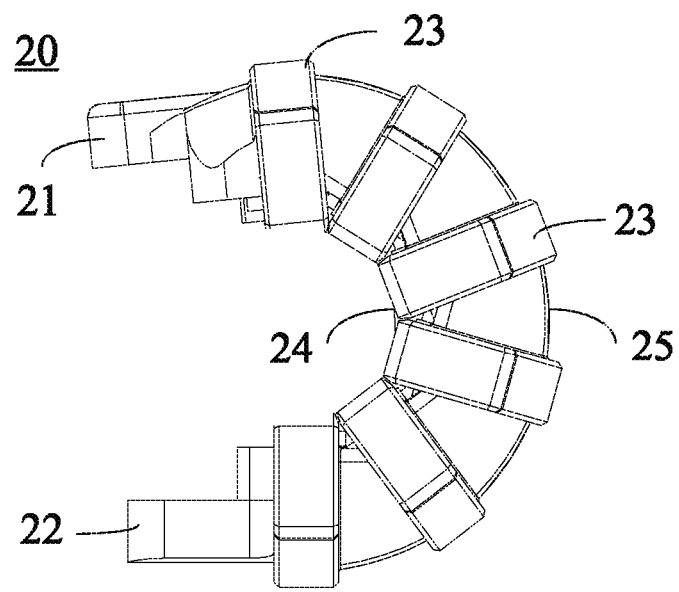
FIG. 6 illustrates the folding mechanism in a folded state of provided by an embodiment of the present disclosure.

Please refer to FIG. 6. FIG. 6 illustrates the folding mechanism in a folded state of provided by an embodiment of the present disclosure. In a folding process, the second end 22 remains unmoving. The first end 21 and the connection components 23 are turned over. In detail, the first end 21 is turned over by external force and then drives the connection components 23 connected to the first end 21. Each of the connection components 23 includes the above-mentioned hinge structure 10. Relative rotation is produced between the connection components 23 by relative rotation between the main support 11 of the hinge structure 10 and the sub support 12 of the sub support 12, so that the folding mechanism 20 is turned over to be an arc shape. The arc shape includes an inner arc length 24 and an outer arc length 25. The inner arc length 24 is the same as a surface length of the folding mechanism 20 in the unfolded state corresponding to the inner arc length 24. The surface length of the folding mechanism 20 corresponding to the inner arc length 24 remains unchanged regardless of the folded state or the unfolded state. The outer arc length 25 is greater than a surface length of the folding mechanism 20 in the unfolded state corresponding to the outer arc length 25. An arc bending area of the folding mechanism 20 can be formed by a length difference between the outer arc length 25 and the inner arc length 24.

Figure 7:
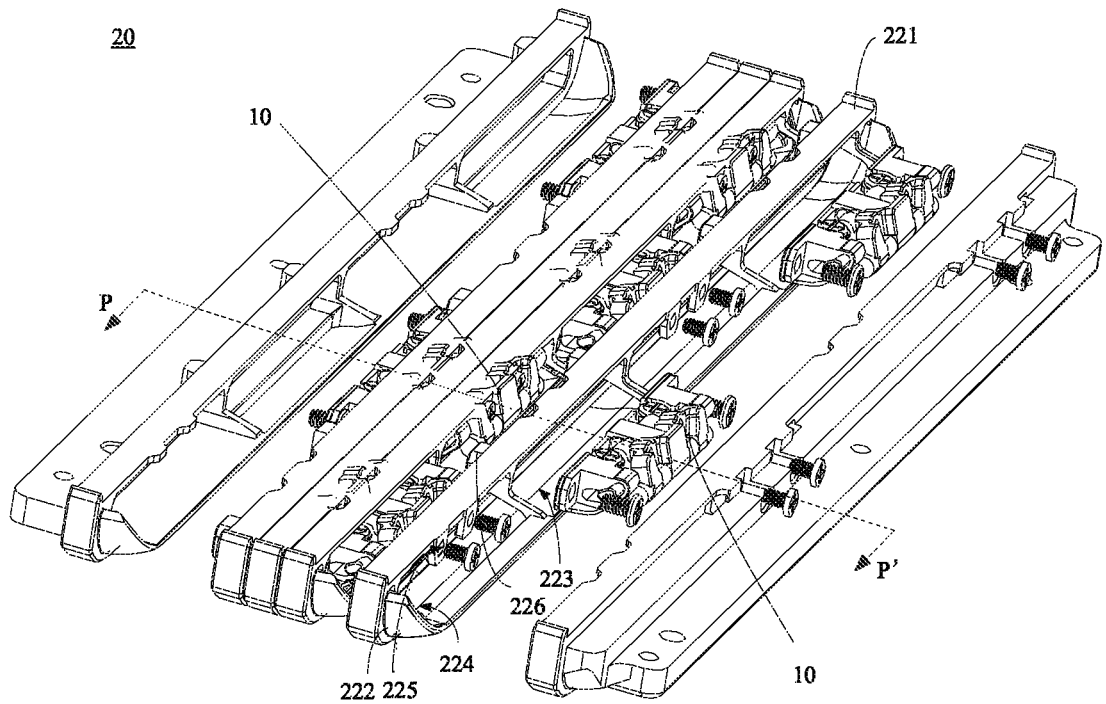
FIG. 7 illustrates an assembly diagram of the folding mechanism provided by an embodiment of the present disclosure.

Please combine FIG. 2 and FIG. 7. FIG. 7 illustrates an assembly diagram of the folding mechanism provided by an embodiment of the present disclosure. Each of the connection components 23 includes two hinge structures 10 which are interlacedly disposed. When two connection components 23 are connected, the hinge structures 10 which are interlacedly disposed on one of the two connection components 23 and the hinge structures 10 which are interlacedly disposed on the other of the two connection components 23 are interlacedly disposed. Each connection component 23 further includes a frame. The frame includes a containing cavity 223, wherein the hinge structure 10 is disposed in the containing cavity 223; a top plate 221; a protruding portion 222, wherein a width of the top plate 221 is smaller than a width of the protruding portion 222; and a containing portion 224. When the folding mechanism 20 is unfolded, the containing portion 224 is configured to contain the protruding portion of one adjacent connection component. When the folding mechanism 20 is folded, the protruding portion of the adjacent connection component protrudes from the containing portion 224. Cooperation of the containing portion 224 and the protruding portions 222 can cause an outer arc of the folding mechanism 20 to be stretched and changed, so that a bending angle of the folding mechanism 20 can be ranged from 0 degree to 190 degrees.

Four screw holes are disposed on the hinge structure 10. Two screw holes 40 are symmetrically disposed on the two symmetrical limit supports 13. Two screw holes 42 are symmetrically disposed on the sub support 12. When assembled, the screw holes 40 of the hinge structure 10 coincide with screw thread holes 226 in the containing cavity 223. The limit supports 13 are fixed to the frame of the connection component 23 via screws. The top plate 221 of the frame further includes two screw holes 225 adapted for screws. The screw holes 225 coincide with the screw holes 42 on the sub support 12. The sub support 12 of another hinge structure 10 is fixed to the top plate 221 of the connection component 23 via the screws. In the above-mentioned connections, a maximum rotation angle and a maximum area of an inner surface of the folding mechanism 20 can be achieved by effectively using space and by a minimum number of the hinge structures 10.

Figure 8:
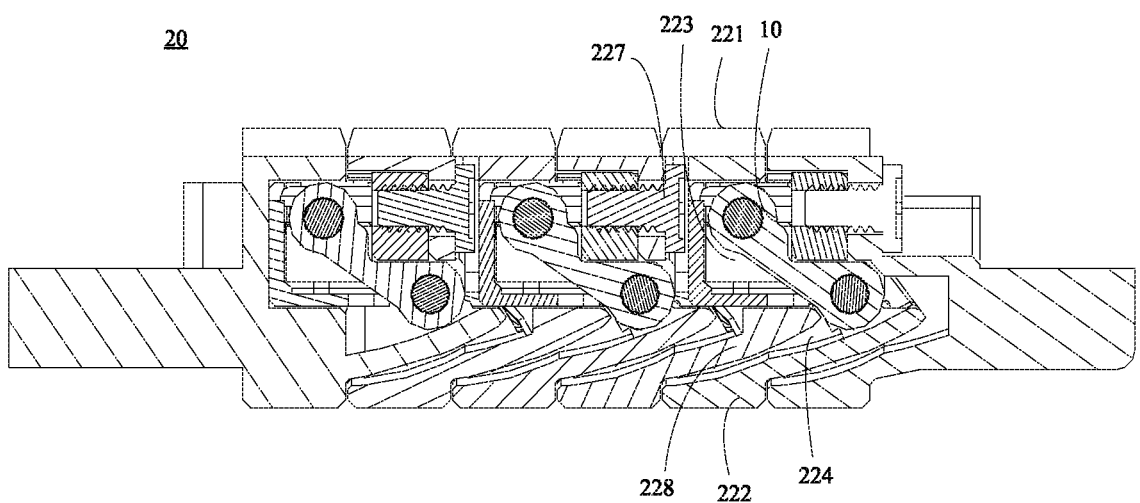
FIG. 8 illustrates a section diagram of the folding mechanism in a direction P-P' in FIG. 7.

Please continue to refer to FIG. 8 to understand the hinge structure more clearly. FIG. 8 illustrates a section diagram of the folding mechanism in a direction P-P' in FIG. 7. The hinge structure 10 is disposed in the containing cavity 223 of the connection component 23. A screw hole 227 is disposed in the top plate 221. The screw hole 227 is adapted for a screw hole of the sub support 12 of the hinge structure 10 of another connection component 23. The top plate 221 is fixed and connected to the sub support 12 of the hinge structure 10 of another connection component 23 via a screw. The containing portion 224 is disposed below the containing cavity 223 and configured to contain a protruding portion 228 of another connection component 23 when the folding mechanism 20 is unfolded. As such, an outer surface of the folding mechanism 20 is approximately plane from a view of an appearance. When the folding mechanism 20 is folded, relative motion is produced between the protruding portions 228 of the connection component 23. The protruding portions 228 of the folding mechanism 20 is changed from a containing state to a protruding state. Relative motion is produced between the main support 11 of the hinge structure 10 and the sub support 12 of the hinge structure 10. Relative motion is produced between the adjacent ones of the connection components 23. A rotation angle is formed between the two adjacent ones of the connection components 23, so that the folding mechanism 20 becomes an arc. A radian of the arc depends on the rotation angle between the two adjacent ones of the connection components 23. Plural rotation angles of the connection components 23 are accumulated, so that the bendable angle of the folding mechanism 20 can be ranged from 0 degree to 190 degrees. The folding mechanism 20 is reliable and stable in folding motion and can freely rotate within a specific angle.

Figure 9:
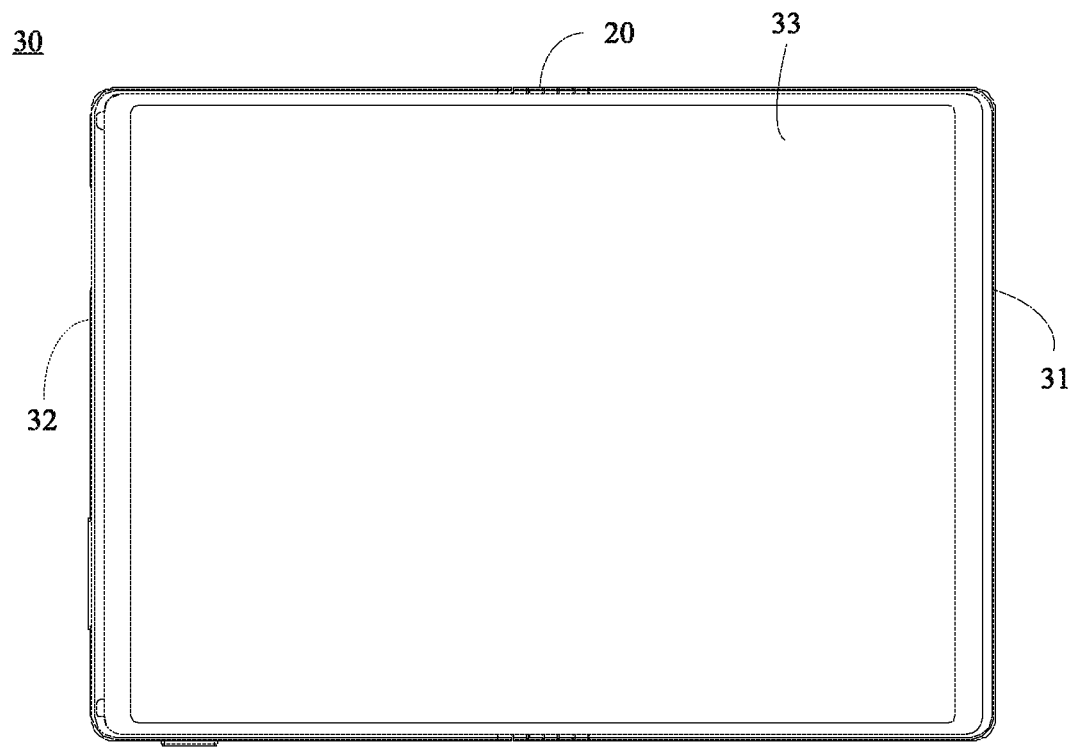
FIG. 9 illustrates a structure diagram of a mobile terminal in an unfolded state provided by an embodiment of the present disclosure.

Please continue to refer to FIG. 9. FIG. 9 illustrates a structure diagram of a mobile terminal in an unfolded state provided by an embodiment of the present disclosure. The mobile terminal 30 includes a first housing 31, a second housing 32, the folding mechanism 20, and a flexible display screen 33. The first housing 31 is connected to the first end 21 of the folding mechanism 20. The second housing 32 is connected to the second end 22 of the folding mechanism 20. The flexible display screen 33 covers the first housing 31, the second housing 32, and the folding mechanism 20. When the mobile terminal is in the unfolded state, the folding mechanism 20 is unfolded to be a flat plane and the flexible display screen 33 covering the folding mechanism 20 is unfolded to be a flat plane. High quality large screen experience can be provided for a user when the mobile terminal 30 in the unfolded state.

Figure 10:
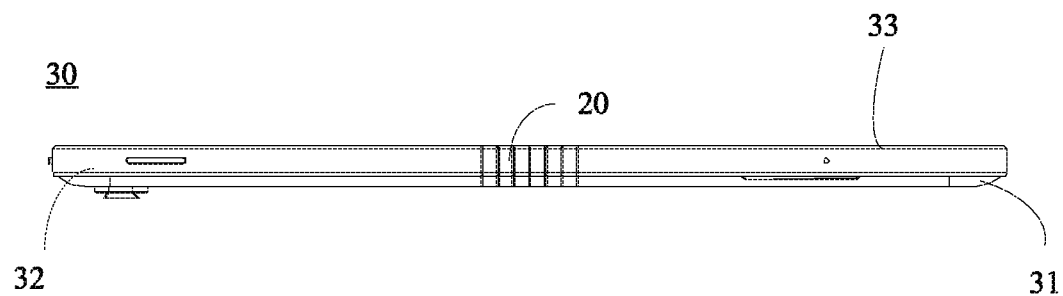
FIG. 10 illustrates another structure diagram of the mobile terminal in an unfolded state provided by an embodiment of the present disclosure.

Please refer to FIG. 10. FIG. 10 illustrates another structure diagram of the mobile terminal in an unfolded state provided by an embodiment of the present disclosure. The folding mechanism 20 is positioned between the first housing 31 and the second housing 32. The mobile terminal 30 can be folded via the folding mechanism 20. The flexible display screen 33 covers the first housing 31, the folding mechanism 20, and the second housing 32. When the mobile terminal is unfolded to be a flat plane, the flexible display screen 33 is a flat plane.

Figure 11:
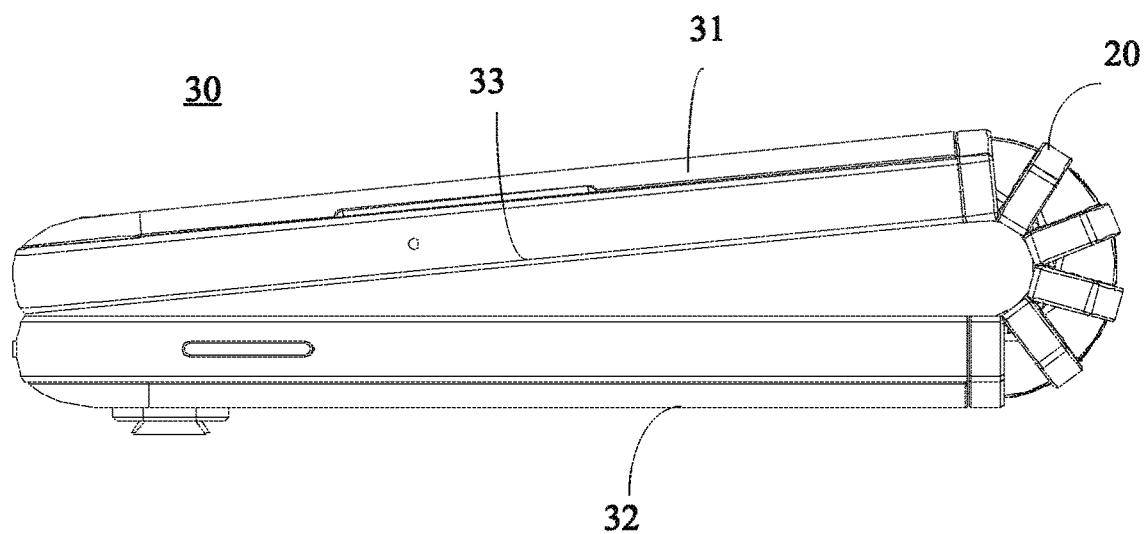
FIG. 11 illustrates a structure diagram of the mobile terminal in a folded state provided by an embodiment of the present disclosure.

Please combine FIG. 2, FIG. 8, and FIG. 11. FIG. 11 illustrates a structure diagram of the mobile terminal in a folded state provided by an embodiment of the present disclosure. When the mobile terminal 30 is folded, the second housing 32 remains unmoving relative to the first housing 31. When the first housing 31 is folded upwardly, the first housing 31 drives the first end 21 of the folding mechanism 20 connected thereto so as to drive the connection components 23 connected to the first end 21. Rotation of the connection components 23 is produced by rotation produced by the hinge structures 10 on the connection components 23. Relative rotation is produced between the sub support 12 of the hinge structure 10 and the main support 11 of the sub support 12. The sub support 12 can rotate relative to the main support 11. The crank sliding block 151 upwardly slides from the lowest point of the limit groove 17. The shaft sleeve 18 drags the straight shaft 14 to slide from the leftmost end of the sliding groove 16 to the right. Since damping motion is produced due to the interference fit between the straight shaft 14 and the sliding groove 16, a specific angle can be formed between the sub support 12 and the main support 11 and the angle remains unchanged. In detail, when the mobile terminal 30 is folded by the user, the user can feel resistance due to damping. When the mobile terminal 30 is folded, a plurality of angles can be formed between the second housing 32 and the first housing 31. The mobile terminal 30 can be stabilized at one of the angles according to the user's requirement. For example, the folding angle of the mobile terminal 30 is ranged from 0 degree to 190 degrees. When the user needs to adjust the folding angle between the second housing 32 of the mobile terminal 30 and the first housing 31 of the mobile terminal 30 to be 60 degrees, external force is applied to the second housing 32 so that the folding angle between the second housing 32 and the first housing 31 is 60 degrees. As such, user's demands for placing angles of the flexible display screen 33 can be satisfied. A number of the angles which can be formed between the second housing 32 and the first housing 31 can be adjusted according to a number of the connection components 23. When the number of the connection components 23 is more, the number of the angles which can be formed between the second housing 32 and the first housing 31 is more. The number of the connection components 23 of the folding mechanism 20 can be adjusted according to a specification parameter (a minimum bend radius), and thus a width of the mobile terminal 30 can be adjusted after being folded. When the number of the connection components 23 of the folding mechanism 20 is fewer, the width of the mobile terminal 30 is smaller after being folded. When the mobile terminal 30 is folded, stress which is generated due to the stretching of the outer surface of the mobile terminal 30 in a situation that the mobile terminal 30 is folded can be decreased by the folding mechanism 20.

Figure 12:
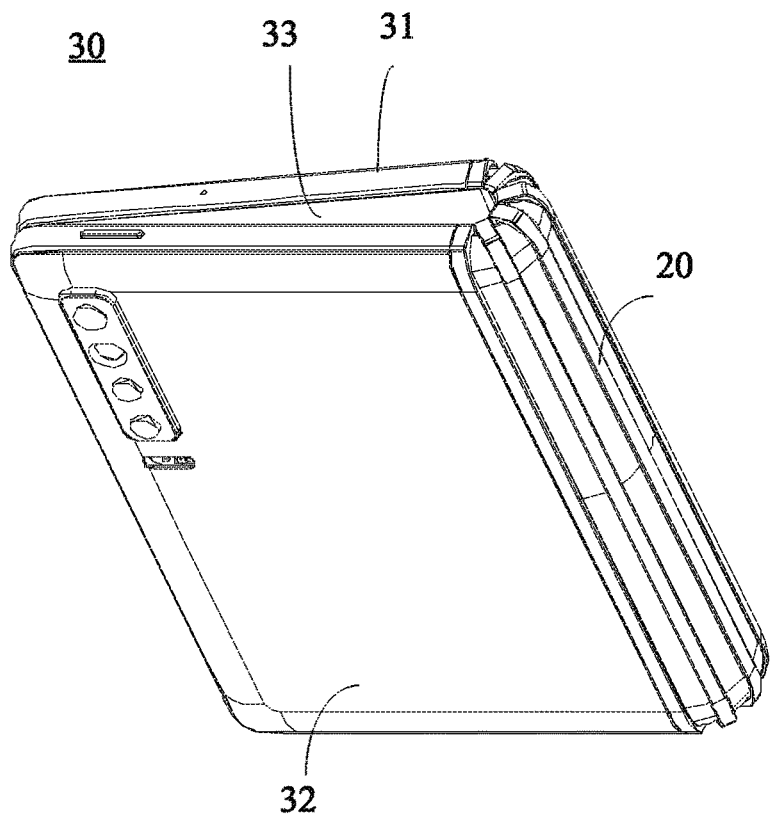
FIG. 12 illustrates another structure diagram of the mobile terminal in a folded state provided by an embodiment of the present disclosure.

Please refer to FIG. 12. FIG. 12 illustrates another structure diagram of the mobile terminal in a folded state provided by an embodiment of the present disclosure. When the mobile terminal 30 is folded, the protruding portion 222 of the folding mechanism 20 protrudes from the containing portion 224 so that the folding mechanism 20 becomes an arc bending portion. A surface area of the mobile terminal 30 is increased. However, a perimeter of an inner arc of the mobile terminal 30 is not changed. Since the perimeter of the inner arc is not changed in the unfolded state and the folded state, a fold is not produced in a process of folding the flexible display screen 33 when the flexible display screen 33 covers the folding mechanism 20. Accordingly, visual effects are smooth and beautiful during the folding process. Moreover, requirements for bending performance of the flexible display screen 33 is decreased.

In some embodiments, the mobile terminal 30 can include the first housing 31, the second housing 32, the flexible display screen 33, a front camera, a rear camera, a control board, and a battery. It is noted that the mobile terminal 30 is not limited to the above-mentioned contents.

The flexible display screen 33 is disposed on the first housing 31, the second housing 32, and the folding mechanism 30. The flexible display screen 33 is electrically connected to the control board to form a display surface of the mobile terminal 30. The flexible display screen 33 can have a regular shape, for example, a cuboid structure. The flexible display screen 33 can cover the whole of the display surface of the mobile terminal 30. That is, full screen display can be implemented by the mobile terminal 30.

In some embodiments, the flexible display screen 33 can be an organic light-emitting diode display (OLED).

The control board is disposed in a housing of the mobile terminal 30. The control board can be a main board of the mobile terminal 30. The control board can include one, two or more of functional components integrated thereinto and including a motor, a microphone, a speaker, an earphone jack, a universal serial bus interface, a front camera, a rear camera, a receiver, a distance sensor, an environmental light sensor, and a processor. It is noted that in the description of the present disclosure, unless indicated otherwise, "more" refers to two or more.

In some embodiments, the control board can be screwed to the housing via screws or can be hooked to the housing in a hooking method. It is noted that the method of fixing the control board in the housing is not limited thereto and can be any other method. For example, a method of combining a hooking method and screws is used to fix the control board.

The mobile terminal 30 can further include a cover plate. The cover plate is assembled on the flexible display screen 33 to cover the flexible display screen 33. The cover plate can be a transparent glass cover plate, so that the flexible display screen 33 can display via the cover plate. In some embodiments, the cover plate can be a glass cover plate made of a material such as sapphire.

The housing can form the external contour of the mobile terminal 30. In some embodiments, the housing can be a housing assembly made of metal, such as magnesium alloy or stainless steel. It is noted that a material of the housing in the embodiment of the present disclosure is not limited to thereto. For example, the housing can be a plastic housing, a ceramic housing, or a glass housing.

It is noted that the mobile terminal of the present disclosure can have only the first state. The mobile terminal has a non-display area. The front camera, the receive, the distance sensor, and the environmental light sensor can be disposed in the non-display area.

Those skilled in the art may understand that the structure of the above-mentioned mobile terminal does not constitute restrictions on the mobile terminal. Compared with what may be shown in the drawings, more or fewer components may be included, or certain components may be combined, or components may be arranged differently.

The hinge structure, the folding mechanism, and the mobile terminal provided by the embodiments of the present disclosure are described in detail as stated above. The principle and implementation of the present disclosure are clarified herein through specific examples. The description about the embodiments of the present disclosure is merely provided to help understand the present disclosure. In addition, those skilled in the art can make variations and modifications to the present disclosure in the specific implementations and the application scope based on the idea of the present disclosure. Therefore, the content of the specification shall not be construed as a limitation on the present disclosure.

What is claimed is:

1. A hinge structure, comprising:
   a main support, wherein the main support comprises a sliding groove disposed therein;
   a limit support, wherein the limit support is rotationally connected to the main support via a straight shaft, the straight shaft is disposed in the sliding groove, and a limit groove is disposed at one side of the limit support;
   a sub support, wherein the sub support is connected to the limit support via a crank shaft, the sub support is sleeved on the crank shaft, a crank sliding block is disposed at one end of the crank shaft, and the crank sliding block is disposed in the limit groove; and
   a shaft sleeve, wherein the shaft sleeve comprises a first sub sleeve and a second sub sleeve which are respectively disposed at two ends of the shaft sleeve, the first sub sleeve is sleeved on the straight shaft, and the second sub sleeve is sleeved on the crank shaft;
   wherein when the main support rotates relative to the sub support, the straight shaft slides in the sliding groove and the crank sliding block slides in the limit groove.

2. The hinge structure of claim 1, wherein there are two limit supports, two crank shafts, and two shaft sleeves; and the main support is disposed between the two limit supports, each of the limit supports is rotationally connected to the main support via the straight shaft, the sub support is disposed between the two crank shafts, and the two shaft sleeves are disposed between the two crank shafts.

3. The hinge structure of claim 2, wherein the two limit supports are disposed at two sides of the main support and symmetrically disposed, and the two crank shafts and the two shaft sleeves are disposed at the two sides of the sub support and symmetrically disposed.

4. The hinge structure of claim 1, wherein the limit groove is an arc limit groove, the sliding groove is a cylindrical sliding groove, the crank sliding block partially fits in the arc limit groove and is slidable in the arc limit groove, a middle portion of the straight shaft is disposed in the cylindrical sliding groove, and a damping slide is produced between the straight shaft and the cylindrical sliding groove.

5. The hinge structure of claim 1, wherein a middle portion of the straight shaft is disposed in the sliding groove, and a damping slide is produced between the straight shaft and the sliding groove by interference fit between the straight shaft and the sliding groove.

6. A folding mechanism, wherein the folding mechanism comprises a first end, a second end, and at least two connection components;
   the first end and the second end are configured to be connected to an external mechanism; and
   each of the connection components comprises at least one hinge structure, two adjacent ones of the connection components are connected via the at least one hinge structure, and the at least two connection components are disposed between the first end and the second end;
   wherein the at least one hinge structure comprises a main support, a limit support, a sub support, and a shaft sleeve;
   the main support comprises a sliding groove disposed therein;
   the limit support is rotationally connected to the main support via a straight shaft, the straight shaft is disposed in the sliding groove, and a limit groove is disposed at one side of the limit support;
   the sub support is connected to the limit support via a crank shaft, the sub support is sleeved on the crank shaft, a crank sliding block is disposed at one end of the crank shaft, and the crank sliding block is disposed in the limit groove; and
   the shaft sleeve comprises a first sub sleeve and a second sub sleeve which are respectively disposed at two ends of the shaft sleeve, the first sub sleeve is sleeved on the straight shaft, and the second sub sleeve is sleeved on the crank shaft;
   wherein when the main support rotates relative to the sub support, the straight shaft slides in the sliding groove and the crank sliding block slides in the limit groove.

7. The folding mechanism of claim 6, wherein there are two limit supports, two crank shafts, and two shaft sleeves, the main support is disposed between the two limit supports, each of the limit supports is rotationally connected to the main support via the straight shaft, the sub support is disposed between the two crank shafts, and the two shaft sleeves are disposed between the two crank shafts.

8. The folding mechanism of claim 7, wherein the two limit supports are disposed at two sides of the main support and symmetrically disposed, and the two crank shafts and the two shaft sleeves are disposed at the two sides of the sub support and symmetrically disposed.

9. The folding mechanism of claim 6, wherein the limit groove is an arc limit groove, the sliding groove is a cylindrical sliding groove, the crank sliding block partially fits in the arc limit groove and is slidable in the arc limit groove, a middle portion of the straight shaft is disposed in the cylindrical sliding groove, and a damping slide is produced between the straight shaft and the cylindrical sliding groove.

10. The folding mechanism of claim 6, wherein each of the at least two connection components comprises two hinge structures which are interlacedly disposed; and
    when the at least two connection components are connected, the hinge structures which are interlacedly disposed on one of the at least two connection components and the hinge structures which are interlacedly disposed on the other of the at least two connection components are interlacedly disposed.

11. The folding mechanism of claim 6, wherein each of the at least two connection components further comprises a frame, and the frame comprises a containing portion and a protruding portion protruding from one side;

when the folding mechanism is in an unfolded state, the containing portion is configured to contain the protruding portion of an adjacent connection component; and when the folding mechanism is in a folded state, the protruding portion of the adjacent connection component protrudes from the containing portion.

12. The folding mechanism of claim 11, wherein the limit support is fixed and connected to the frame, and the sub support is fixed and connected to the frame of the adjacent connection component.

13. A mobile terminal, wherein the mobile terminal comprises a first housing, a second housing, a flexible display screen, and a folding mechanism;

the first housing is connected to the second housing via the folding mechanism, and the flexible display screen is disposed on the first housing, the folding mechanism, and the second housing;

when the first housing and the second housing are in a folded state, the flexible display screen is bent;

when the first housing and the second housing are in an unfolded state, the flexible display screen is unfolded to be a flat plane;

the folding mechanism comprises a first end, a second end, and at least two connection components;

the first end is configured to be connected to the first housing, and the second end is configured to be connected to the second housing; and each of the connection components comprises at least one hinge structure, two adjacent ones of the connection components are connected via the at least one hinge structure, and the at least two connection components are disposed between the first end and the second end;

wherein the hinge structure comprises a main support, a limit support, a sub support, and a shaft sleeve;

the main support comprises a sliding groove disposed therein;

the limit support is rotationally connected to the main support via a straight shaft, the straight shaft is disposed in the sliding groove, and a limit groove is disposed at one side of the limit support;

the sub support is connected to the limit support via a crank shaft, the sub support is sleeved on the crank shaft, a crank sliding block is disposed at one end of the crank shaft, and the crank sliding block is disposed in the limit groove; and the shaft sleeve comprises a first sub sleeve and a second sub sleeve which are respectively disposed at two ends of the shaft sleeve, the first sub sleeve is sleeved on the straight shaft, and the second sub sleeve is sleeved on the crank shaft;

wherein when the main support rotates relative to the sub support, the straight shaft slides in the sliding groove and the crank sliding block slides in the limit groove.

14. The mobile terminal of claim 13, wherein there are two limit supports, two crank shafts, and two shaft sleeves;

the main support is disposed between the two limit supports, each of the limit supports is rotationally connected to the main support via the straight shaft, the sub support is disposed between the two crank shafts, and the two shaft sleeves are disposed between the two crank shafts.

15. The mobile terminal of claim 14, wherein the two limit supports are disposed at two sides of the main support and symmetrically disposed, and the two crank shafts and the two shaft sleeves are disposed at the two sides of the sub support and symmetrically disposed.

16. The mobile terminal of claim 13, wherein the limit groove is an arc limit groove, the sliding groove is a cylindrical sliding groove, the crank sliding block partially fits in the arc limit groove and is slidable in the arc limit groove, a middle portion of the straight shaft is disposed in the cylindrical sliding groove, and a damping slide is produced between the straight shaft and the cylindrical sliding groove.

17. The mobile terminal of claim 13, wherein each of the at least two connection components comprises two hinge structures which are interlacedly disposed; and when the at least two connection components are connected, the hinge structures which are interlacedly disposed on one of the at least two connection components and the hinge structures which are interlacedly disposed on the other of the at least two connection components are interlacedly disposed.

18. The mobile terminal of claim 13, wherein each of the at least two connection components further comprises a frame, and the frame comprises a containing portion and a protruding portion;

when the folding mechanism is in an unfolded state, the containing portion is configured to contain the protruding portion of an adjacent connection component; and when the folding mechanism is in a folded state, the protruding portion of the adjacent connection component protrudes from the containing portion.

19. The mobile terminal of claim 18, wherein the limit support is fixed and connected to the frame, and the sub support is fixed and connected to the frame of the adjacent connection component.

20. The mobile terminal of claim 13, wherein when the first housing rotates relative the second housing, the folding mechanism causes the first housing and the second housing to be stabilized at one of a plurality of angles.

* * * * *